(12) United States Patent
Lee et al.

(10) Patent No.: US 11,612,052 B2
(45) Date of Patent: Mar. 21, 2023

(54) CIRCUIT BOARD AND DISPLAY DEVICE INCLUDING THE SAME

(71) Applicant: Samsung Display Co., Ltd., Yongin-si (KR)

(72) Inventors: Hyo-Chul Lee, Hwaseong-si (KR); Ji-Won Kim, Hwaseong-si (KR); In Soo Wang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/239,652

(22) Filed: Apr. 25, 2021

(65) Prior Publication Data
US 2022/0030700 A1 Jan. 27, 2022

(30) Foreign Application Priority Data
Jul. 24, 2020 (KR) .......................... 10-2020-0092391

(51) Int. Cl.
*H05K 5/00* (2006.01)
*H05K 1/02* (2006.01)
*H05K 1/18* (2006.01)

(52) U.S. Cl.
CPC ........... *H05K 1/0231* (2013.01); *H05K 1/189* (2013.01); *H05K 2201/10128* (2013.01)

(58) Field of Classification Search
CPC ................. H05K 1/0231; H05K 1/189; H05K 2201/10128
See application file for complete search history.

(56) References Cited

U.S. PATENT DOCUMENTS

| 5,739,887 | A | * | 4/1998 | Ueda | G02F 1/13452 349/149 |
|---|---|---|---|---|---|
| 9,900,991 | B2 | | 2/2018 | Kang et al. | |
| 10,069,209 | B2 | | 9/2018 | Ramachandran et al. | |
| 2007/0076320 | A1 | * | 4/2007 | Endo | H01L 24/24 360/99.15 |
| 2011/0220979 | A1 | * | 9/2011 | Kawashima | H01L 23/50 257/296 |

FOREIGN PATENT DOCUMENTS

KR 10-2088973 3/2020

\* cited by examiner

*Primary Examiner* — Binh B Tran
(74) *Attorney, Agent, or Firm* — H.C. Park & Associates, PLC

(57) ABSTRACT

A circuit board for a display device includes: a signal line to transmit signal, a first metallic layer overlapping the signal line, a first conductive layer spaced apart from the first metallic layer, a base layer insulating the signal line from the first metallic layer and from the first conductive layer, and a first capacitor including a first terminal electrically coupled to the first metallic layer and a second terminal electrically coupled to the first conductive layer.

18 Claims, 9 Drawing Sheets

CIRCUIT BOARD AND DISPLAY DEVICE INCLUDING THE SAME

CROSS-REFERENCE TO RELATED APPLICATION

This application claims priority from and the benefit of Korean Patent Application No. 10-2020-0092391, filed on Jul. 24, 2020, which is hereby incorporated by reference for all purposes as if fully set forth herein.

BACKGROUND

Field

Embodiments of the invention relate generally to a display device, and more specifically, to a display device including a circuit board in which signal lines are disposed.

Discussion of the Background

A multimedia electronic device such as a television, a mobile phone, a tablet computer, a navigation system unit, and a game console is equipped with a display device for displaying an image. The display device includes a display panel and a driving integrated circuit (IC) which is connected to one side of the display panel to drive the display panel. The driving integrated circuit generates driving signals and provides the driving signals to display panels.

The driving integrated circuit may be mounted on a circuit board, for example, a printed circuit board (PCB) or a flexible printed circuit board (FPCB). One side of the circuit board may be connected to one side of a display panel, and the other side thereof may be connected to a main processor. The driving integrated circuit may receive a driving voltage and control signals from the main processor through the circuit board.

The circuit board may include signal lines to transmit the control signals received from the main processor to the driving integrated circuit. The signal transmission characteristics of the signal lines disposed in the circuit board may affect the display quality of the display device.

The above information disclosed in this Background section is only for understanding of the background of the inventive concepts, and, therefore, it may contain information that does not constitute prior art.

SUMMARY

Applicant recognized that when length of the signal lines disposed in the circuit board of a display device increases, the signal transmission characteristics deteriorate.

Circuit boards and display devices including the same constructed according to the principles and illustrative implementations of the invention are capable of improving signal transmission characteristics by, e.g., adjusting the capacitance between a signal line disposed in the circuit board and a conductive layer of the circuit board. Accordingly, the circuit board may reduce or prevent the deterioration in signal transmission characteristics even when the length of signal lines is increased. Therefore, it is possible to reduce or prevent the deterioration in display quality of a display device.

Additional features of the inventive concepts will be set forth in the description which follows, and in part will be apparent from the description, or may be learned by practice of the inventive concepts.

According to one aspect of the invention, a circuit board for a display device includes: a signal line to transmit signal, a first metallic layer overlapping the signal line, a first conductive layer spaced apart from the first metallic layer, a base layer insulating the signal line from the first metallic layer and from the first conductive layer, and a first capacitor including a first terminal electrically coupled to the first metallic layer and a second terminal electrically coupled to the first conductive layer.

The first metallic layer may include a first floating layer having a generally polygonal shape entirely overlapping the signal line.

The first conductive layer may be configured to receive a ground voltage.

The first terminal of the first capacitor may directly contact the first metallic layer, and the second terminal thereof may directly contact the first conductive layer.

The first metallic layer and the first conductive layer may be formed of the same material and disposed on a first surface of the base layer.

The circuit board may further include a second metallic layer overlapping the signal line, a second conductive layer spaced apart from the second metallic layer, and a second capacitor including a first terminal electrically coupled to the second metallic layer and a second terminal electrically coupled to the second conductive layer.

The second metallic layer and the second conductive layer may be formed of the same material and disposed on a second surface of the base layer, and the base layer may insulate the signal line from the second metallic layer and the second conductive layer.

A capacitance between the signal line and the first conductive layer may be determined by a parasitic capacitance between the signal line and the first metallic layer and a first capacitance of the first capacitor and the first capacitance of the first capacitor may be determined in relation to the parasitic capacitance between the signal line and the first metallic layer.

According to another aspect of the invention, a display device includes: a display panel to display images and including a first pad, and a circuit board including a second pad to be connected to the first pad of the display panel. The circuit board may include a signal line to transmit signal, a first metallic layer overlapping the signal line, a first conductive layer spaced apart from the first metallic layer, a base layer insulating the signal line from the first metallic layer and from the first conductive layer, and a first capacitor including a first terminal electrically coupled to the first metallic layer and a second terminal electrically coupled to the first conductive layer.

The circuit board may further include a driving circuit to be electrically connected to the second pad.

The circuit board may further include a connector, and the signal line may be electrically coupled to the driving circuit and the connector.

The first metallic layer may include a first floating layer having a generally polygonal shape entirely overlapping the signal line.

The first conductive layer may be configured to receive a ground voltage.

The first terminal of the first capacitor may directly contact the first metallic layer, and the second terminal thereof may directly contact the first conductive layer.

The first metallic layer and the first conductive layer may be formed of the same material and may be disposed on a first surface of the base layer.

The circuit board may further include a second metallic layer overlapping the signal line, a second conductive layer spaced apart from the second metallic layer, and a second capacitor including a first terminal electrically coupled to the second metallic layer and a second terminal electrically coupled to the second conductive layer.

The second metallic layer and the second conductive layer may be formed of the same material and disposed on a second surface of the base layer, and the base layer may insulate the signal line from the second metallic layer and from the second conductive layer.

The first capacitance of the first capacitor may be determined in relation to the parasitic capacitance between the signal line and the first metallic layer.

The circuit board may include a flexible circuit board.

The base layer may include an insulation layer having flexibility.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
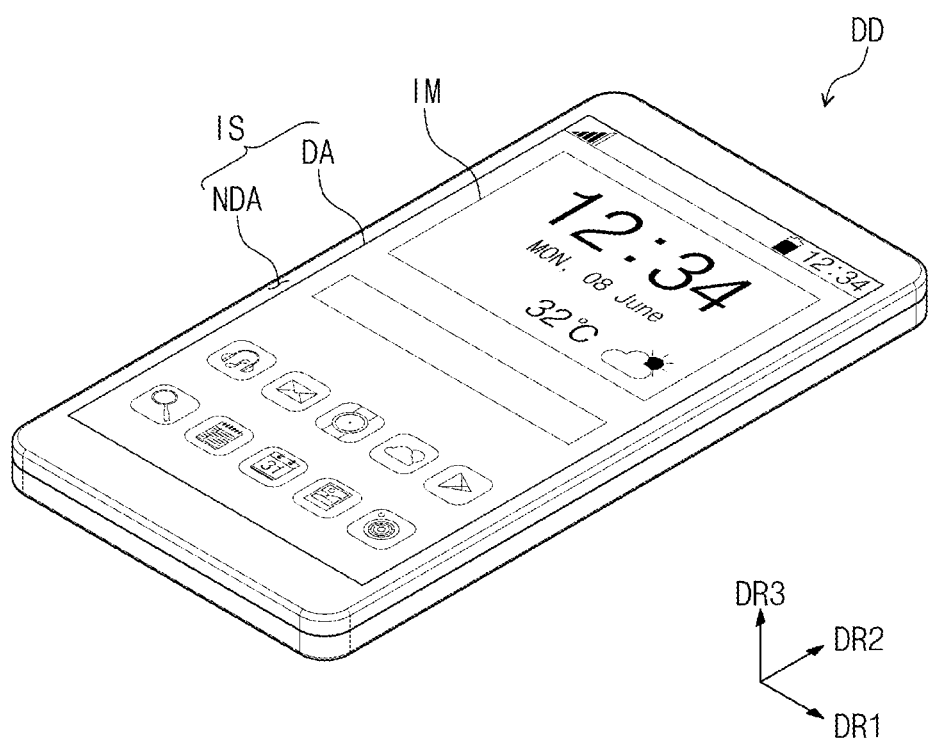
FIG. 1 is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an embodiment of a display device constructed according to the principles of the invention.

Referring to FIG. 1, a display device DD may be a liquid crystal display device, a field emission display device, a plasma display device, or an organic light emitting display device. However, this is only exemplary. The display device DD is not limited to the types of display devices listed above.

In FIG. 1, as an example of the display device DD, a flat panel display device is illustrated. However, the embodiments of the invention are not limited thereto. The display device DD may be a foldable display device or a rollable display device, and is not particularly limited. The display device DD may be used in a large-sized electronic device such as a television and a monitor and in a small- and -medium-sized electronic device and the like such as a mobile phone, a tablet computer, a car navigation system unit, a game console, and a smart watch.

The display device DD may display an image toward a third direction DR3 on a display surface IS parallel to each of a first direction DR1 and a second direction DR2. The display surface IS of the display device DD may include one or more regions. The display surface IS on which an image is displayed may correspond to a front surface of the display device DD. The display device DD includes a display region DA on which an image IM is displayed and a non-display region NDA adjacent to the display region DA. The non-display region NDA is a region on which an image is not displayed. The non-display region NDA may be referred to as a bezel region.

As an example, the display region DA may have a generally quadrangular shape. The non-display region NDA may surround the display region DA. However, the embodiments of the invention are not limited thereto. The shape of the display region DA and the shape of the non-display region NDA may be correlatively designed.

Figure 2A:
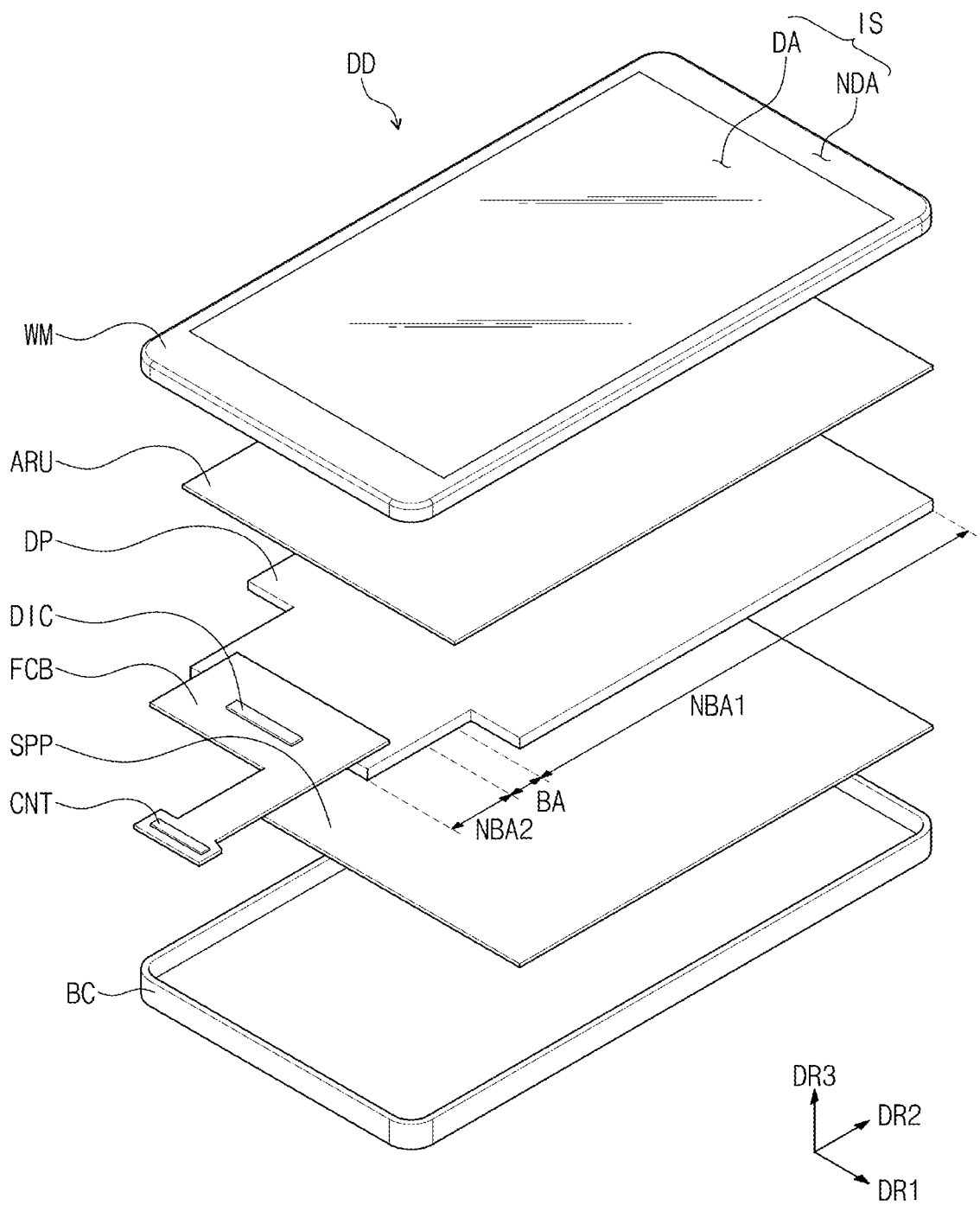
FIG. 2A and FIG. 2B are exploded perspective views of the display device of FIG.
Figure 2B:
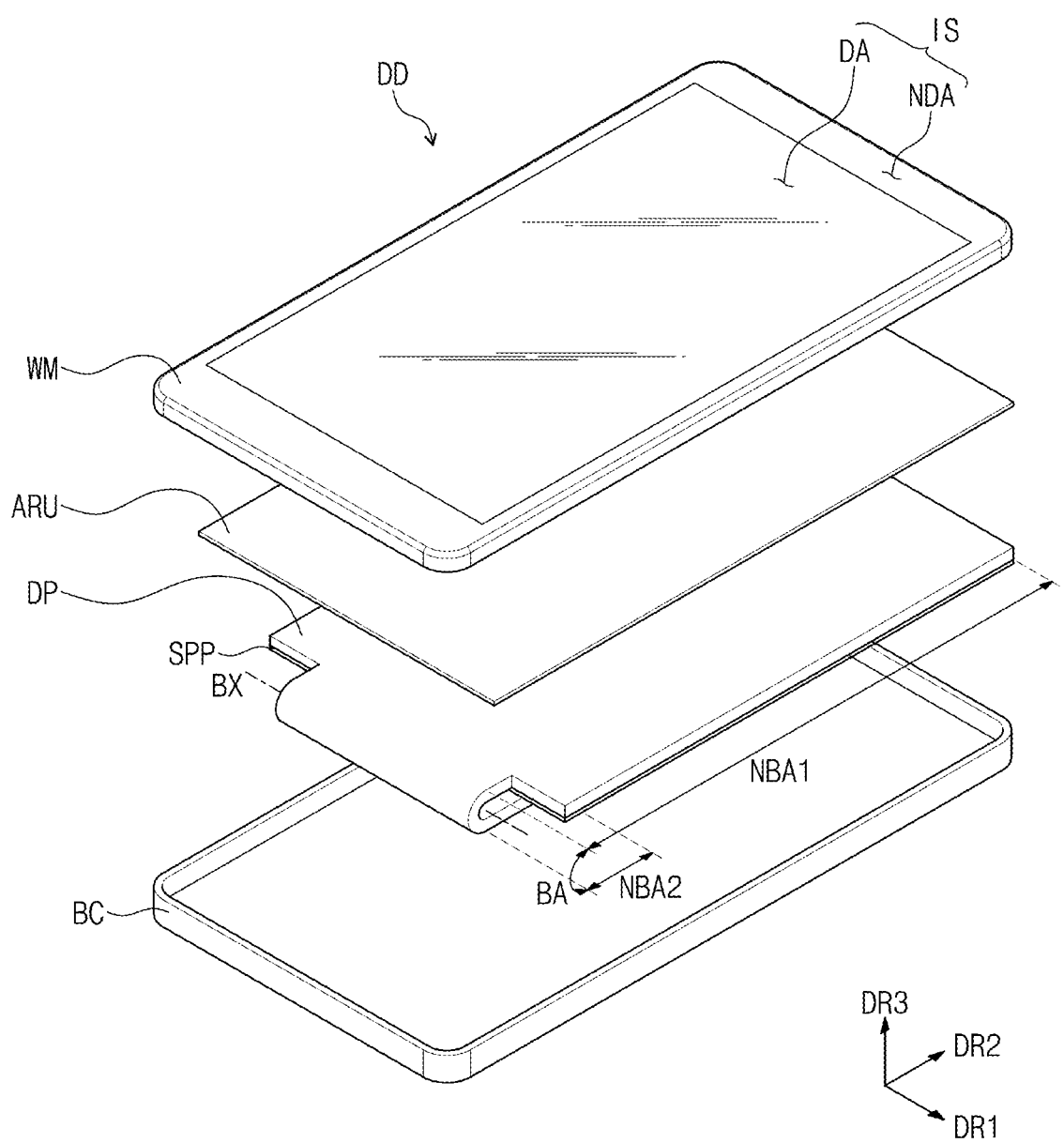

FIG. 2A and FIG. 2B are exploded perspective views of the display device of FIG. 1. Specifically, FIG. 2A shows the display device DD including the display panel DP in an unfolded (i.e., flat) position and FIG. 2B shows the display device DD including the display panel DP in a bent position.

Referring to FIG. 2A and FIG. 2B, the display device DD includes a window member WM, an anti-reflection unit ARU, a display panel DP, a circuit board FCB, a support member SPP, and a lower case or bracket BC.

The window member WM provides a front surface of the display device DD. The window member WM may include a glass substrate, a sapphire substrate, a plastic substrate, and the like. Also, the window member WM may include a functional coating layer such as an anti-fingerprint layer, an anti-reflection layer, and a hard coating layer. In an embodiment, FIG. 2A and FIG. 2B illustrate the window member WM having a generally flat shape in a display region DA. However, the shape of the window member WM may be changed. Edges of the window member WM facing in the first direction DR1 may provide a curved surface.

A front surface (or an upper surface, or a first surface) and a back surface (or a lower surface, or a second surface) of each member are defined on the basis of a direction in which an image is displayed. However, directions indicated by the first to third directions DR1, DR2, and DR3 are a relative concept, and may be converted to different directions.

The display panel DP is disposed on a back surface of the window member WM and generates an image. Also, the display panel DP may detect a touch input of a user. The display panel DP which provides a generally flat display surface is illustratively shown. However, the shape of the display panel DP may be changed. Edges facing in the first direction DR1 of the display panel DP may be bent from center portions to provide a curved surface.

The display panel DP is a panel which displays an image, and may be any one of a liquid crystal display (LCD) panel, an electrophoretic display panel, an organic light emitting diode (OLED) panel, a light emitting diode (LED) panel, an inorganic electro luminescent (EL) display panel, a field emission display (FED) panel, a surface-conduction electron-emitter display (SED) panel, a plasma display panel (PDP), a cathode ray tube (CRT), an ultra-small light emitting device display panel, a micro LED display panel, a quantum dot panel or other known display panel. Hereinafter, an organic light emitting display device will be illustratively described, and the display panel DP will also be described as being an organic light emitting panel. However, the display device DD and the display panel DP are not limited thereto. Various types of display devices and display panels may be used.

The display panel DP may include a first non-bending portion NBA1, a second non-bending portion NBA2, and a bendable portion BA. The first non-bending portion NBA1 may correspond to a portion of a display region DA (see FIG. 4) and a portion of a non-display region NDA (see FIG. 4) of the display panel DP. The second non-bending portion NBA2 and the bendable portion BA may correspond to the non-display region NDA (see FIG. 4) of the display panel DP.

The bendable portion BA of the display panel DP may be disposed between the first non-bending portion NBA1 and the second non-bending portion NBA2. The first non-bending portion NBA1, the bendable portion BA, and the second non-bending portion NBA2 may be sequentially disposed in the second direction DR2. The maximum width of the bendable portion BA and the second non-bending portion NBA2 in the first direction DR1 may be smaller than the maximum width of the first non-bending portion NBA1.

FIG. 2A illustratively shows a position in which the display panel DP is unfolded, and FIG. 2B illustratively shows a position in which the bendable portion BA of the display panel DP is bent. In the position in which the first non-bending portion NBA1 of the display panel DP and the support member SPP are coupled, the bendable portion BA of the display panel DP may be bent. In the position in which the display panel DP is bent, the second non-bending portion NBA2 of the display panel DP and the first non-bending portion NBA1 of the display panel DP may overlap. The bendable portion BA may be bent along a bending axis BX substantially parallel to the first direction DR1. The display panel DP may be housed in the lower case BC while being bent.

The anti-reflection unit ARU is disposed between the window member WM and the display panel DP. The anti-reflection unit ARU may include a polarizing film and/or a phase retardation film. Depending on the operating principle of the anti-reflection unit ARU, the number of phase retardation films and the phase retardation length of the phase retardation film may be determined. The anti-reflection unit ARU may include color filters.

The circuit board FCB may be a printed circuit board (PCB) or a flexible printed circuit board (FPCB). One end of the circuit board FCB may be bonded on pads disposed in one region of the display panel DP to be electrically connected to the display panel DP.

The circuit board FCB may include a driving circuit DIC. The driving circuit DIC may be implemented as an integrated circuit (IC) and mounted on the circuit board FCB in a chip on film (COF) manner. On the circuit board FCB, one or more passive elements and active elements may further be mounted. The other end of the circuit board FCB may include a connector CNT which may be electrically connected to a main board equipped with a main processor.

The circuit board FCB transmits a signal received from the main circuit board to the integrated circuit IC through signal lines, and may provide a signal output from the integrated circuit IC to the display panel DP.

The support member SPP is disposed on a back surface of the display panel DP and supports the display panel DP. The support member SPP may be a metal plate having more rigidity than a reference material. For example, the support member SPP may be a stainless steel plate. The color of the support member SPP may be black in order to block external light incident on the display panel DP. In another embodiment, the support member SPP may be omitted. In an embodiment, the support member SPP may be a protection film.

The window member WM and the lower case BC may be coupled to each other to house the anti-reflection unit ARU, the display panel DP, the support member SPP, and the circuit board FCB.

Figure 3:
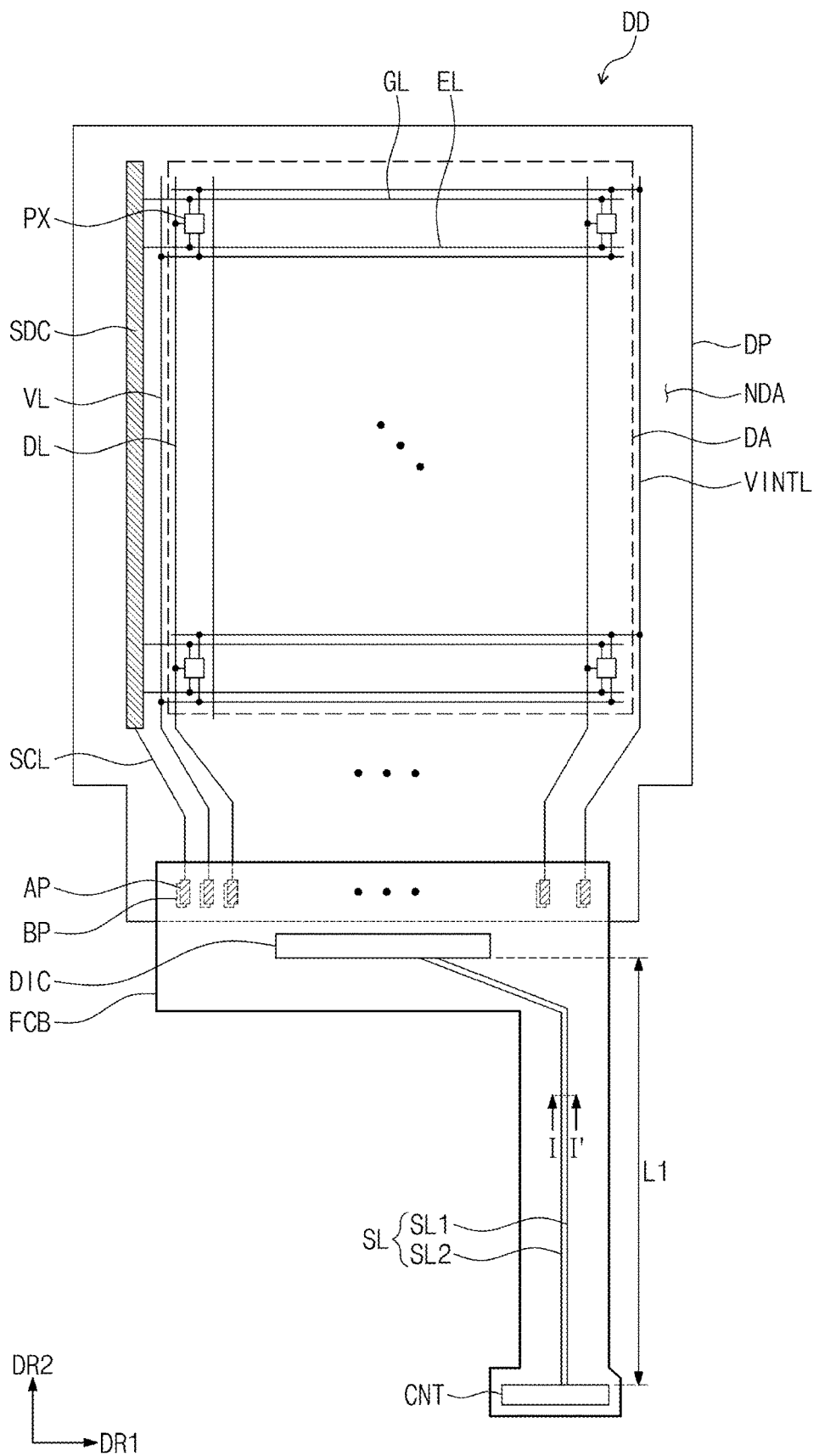
FIG. 3 is a plan view of the display panel and the circuit board shown in FIG. 2A.
Figure 4:
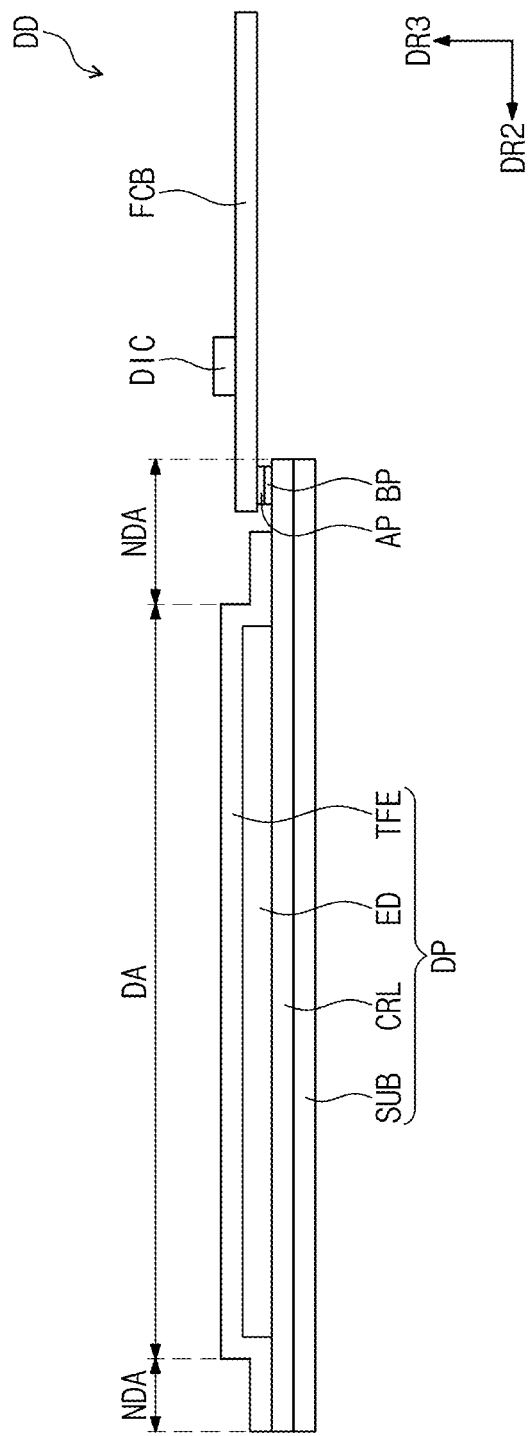
FIG. 4 is a cross-sectional view illustratively showing the connection between the display panel and the circuit board of FIG. 2A.

FIG. 3 is a plan view of the display panel and the circuit board shown in FIG. 2A. FIG. 4 is a cross-sectional view illustratively showing the connection between the display panel and the circuit board of FIG. 2A.

Referring FIG. 3 and FIG. 4, the display device DD may include the display panel DP and the circuit board FCB. FIG. 3 and FIG. 4 illustrate the circuit board FCB in an unfolded position. However, the circuit board FCB may be bent in the direction of the back surface of the display panel DP.

The display panel DP includes a substrate SUB, a circuit element layer CRL, a light emitting element layer ED, and a thin film encapsulation layer TFE. The display panel DP may further include functional layers such as a refractive index control layer.

The substrate SUB may include at least one plastic film. The substrate SUB may include a plastic substrate, a glass substrate, a metal substrate, or an organic/inorganic composite material substrate. The substrate SUB may be formed of a flexible material, for example, polyimide.

The circuit element layer CRL may include one or more insulation layers, one or more conductive layers, and a semiconductor layer. The one or more conductive layers of the circuit element layer CRL may constitute signal lines or a control circuit of a pixel.

The light emitting element layer ED includes at least organic light emitting diodes. The light emitting element layer ED may further include an organic film such as a pixel definition film.

The thin film encapsulation layer TFE encapsulates the light emitting element layer ED. The thin film encapsulation layer TFE may include at least one inorganic film (hereinafter, an encapsulation inorganic film) or at least one organic film (hereinafter, an encapsulation organic film). The encapsulation inorganic film protects the light emitting element layer ED from moisture/oxygen, and an encapsulation organic film protects the light emitting element layer ED from foreign matters such as dust particles. The encapsulation inorganic film may include a silicon nitride layer, a silicon oxynitride layer, a silicon oxide layer, a titanium oxide layer, an aluminum oxide layer, or the like. The encapsulation organic film may include an acrylic organic layer, but is not limited thereto. In addition, the principles of the invention are not limited thereto, and the display panel DP may include, not the thin film encapsulation layer TFE but an encapsulation substrate which encapsulates the light emitting element layer ED. The encapsulation substrate may be composed of glass, sapphire, plastic, and the like. The thin film encapsulation layer TFE may be disposed in the non-display region NDA as well as in the display region DA.

The display panel DP includes a display region DA and a non-display region NDA on a plane. The display region DA and the non-display region NDA of the display panel DP respectively correspond to the display region DA (see FIG. 1) and the non-display region NDA (see FIG. 1) of the display device DD, and thus, are denoted by the same reference numerals. The display region DA and the non-display region NDA of the display panel DP may not necessarily be the same as the display region DD-DA (see FIG. 1) and the non-display region DD-NDA (see FIG. 1) of the display device DD, and may be changed according to the structure and/or design of the display panel DP. The light emitting element layer ED illustrated in FIG. 4 may be disposed in the display region DA.

The display panel DP includes one or more pixels PX. A region in which the one or more pixels PX are disposed is defined as the display region DA. In the illustrated embodiment, the non-display region NDA may be defined along the edge of the display region DA.

The display panel DP may include scan lines GL, data lines DL, light emitting lines EL, a scan control line SCL, an initialization voltage line VINTL, and a voltage line VL.

On one side of the non-display region NDA, a scan driving circuit SDC to which the scan lines GL and the light emitting lines EL are connected may be disposed.

The scan lines GL are extended in the first direction DR1 from the scan driving circuit SDC, and is respectively connected to a corresponding pixel PX among the one or more pixels PX. Each of the light emitting lines EL is extended in the first direction DR1 from the scan driving circuit SDC, and may be arranged in parallel to a corresponding scan line among the scan lines GL. The data lines DL are extended in the second direction DR2, and is respectively connected to a corresponding pixel PX among the one or more pixels PX. The scan control line SCL may provide control signals to the scan driving circuit SDC. The initialization voltage line VINTL may provide an initialization voltage to one or more pixels PX. The voltage line VL is connected to one or more pixels PX, and may provide a first voltage to one or more pixels PX. The voltage line VL may include one or more lines extending in the first direction DR1 and one or more lines extending in the second direction DR2.

Some of the scan lines GL, the data lines DL, the light emitting lines EL, the scan control line SCL, the initialization voltage line VINTL, and the voltage line VL may be disposed on the same layer, and some thereof may be disposed on different layers.

In the non-display region NDA on the circuit element layer CRL of the display panel DP, panel pads BP are arranged. The panel pads BP may be arranged in parallel in the first direction DR1. The panel pads BP are illustrated and described as being arranged in one line in the first direction DR1, but the embodiments are not limited thereto. For example, the panel pads BP may be arranged in two or more lines, or may be arranged in a zigzag form.

The data lines DL, the scan control line SCL, the initialization voltage line VINTL, and the voltage line VL are connected to the panel pads BP.

The panel pads BP of the display panel DP may be connected to the substrate pads AP of the circuit board FCB. The circuit board FCB may include the driving circuit DIC. The driving circuit DIC may be composed of the integrated circuit IC. The circuit board FCB may be a flexible printed circuit board on which the driving circuit DIC, which is an integrated circuit, may be mounted. On the circuit board FCB of FIG. 3, one driving circuit DIC is mounted. However, a number of integrated circuits may be mounted on the circuit board FCB. For example, the driving circuit DIC may include a data driver (or a source driver) to drive the data lines DL of the display panel DP.

FIG. 3 and FIG. 4 illustrate the driving circuit DIC as being disposed on an upper surface of the circuit board FCB, but the embodiments are not limited thereto. The driving circuit DIC may be disposed on a back surface of the circuit board FCB FIG. 3 and FIG. 4 illustrate the display panel DP and the circuit board FCB as being electrically connected to each other through the panel pads BP and the substrate pads AP. However, the display panel DP and the circuit board FCB may be electrically connected by being in direct contact with each other without separate pads.

A number of signal lines to electrically connect the substrate pads AP and the driving circuit DIC may be arranged on the circuit board FCB.

The panel pads BP of the display panel DP illustrated in FIG. 3 are arranged on an upper surface of the display panel DP, and the substrate pads AP are arranged on the back surface of the circuit board FCB. Therefore, when the panel pads BP and the substrate pads AP are connected, some regions of the circuit board FCB overlap a portion of an upper side of the display panel DP.

When the panel pads BP and the substrate pads AP are connected, the panel pads BP and the substrate pads AP are not visible from the upper surface of the circuit board FCB. Therefore, in FIG. 3, the panel pads BP and the substrate pads AP are marked with dotted lines. In another embodiment, the panel pads BP may be arranged on the back surface of the display panel DP, and the substrate pads AP may be arranged on the upper surface of the circuit board FCB. In this case, when the panel pads BP and the substrate pads AP are connected, some regions of the display panel DP may overlap a portion of an upper side of the circuit board FCB.

One end of the circuit board FCB includes a connector CNT. The connector CNT may be electrically connected to the main circuit board equipped with the main processor. The connector CNT may include pads.

In the illustrated embodiment, the substrate pads AP, the panel pads BP, and the connector CNT are terms defined for convenience of description, and embodiments of the invention are not limited thereto.

To facilitate understanding of the connection of pads, in FIG. 3, the substrate pads AP and the panel pads BP are illustrated as not being completely connected. However, it is preferable that the substrate pads AP and the panel pads BP are connected sufficiently and completely. When the substrate pads AP and the panel pads BP are connected sufficiently and completely, control signals and image signals from the driving circuit DIC may be transmitted to the display panel DP without substantial distortion.

The circuit board FCB may include signal lines SL electrically connected to the connector CNT. The signal lines SL may include signal lines SL1 and SL2 which electrically connect the driving circuit DIC and the connector CNT. The signal lines SL may further include signal lines to connect the substrate pads AP or electronic elements not illustrated in the drawings to the connector CNT.

When a length L1 of the signal lines SL between the driving circuit DIC and the connector CNT increases for various reasons, line resistance or parasitic capacitance may increase. In this case, a signal transmitted through the signal lines SL may be distorted.

The driving circuit DIC may transmit and receive a signal to and from a main processor connected to the connector CNT by any one of various interface methods. An interface method may be any one of a universal serial interface (USI), a CPU interface, a RGB interface, a mobile industry processor interface (MIPI), a mobile display digital interface (MDDI), a compact display port (CDP), a mobile pixel link (MPL), a current mode advanced differential signaling (CMADS), a serial peripheral interface (SPI), an inter-integrated circuit (I2C) interface, display port (DP) and embedded display port (eDP) interfaces, a camera control interface (CCI), a camera serial interface (CSI), a micro controller unit (MCU) interface, a high definition multimedia interface (HDMI), and an intra panel interface (IPI). In addition, the interface method may be one of various high speed serial interface methods.

As an example, the MIPI interface, which one of the high speed interfaces, requires an insertion loss to be −5 dB or greater when a frequency is 1.5 GHz. However, when the length L1 of the signal lines SL between the driving circuit DIC and the connector CNT increases, the insertion loss is lowered to −5 dB or less, so that the specification of the MIPI interface may not be satisfied.

Figure 5:
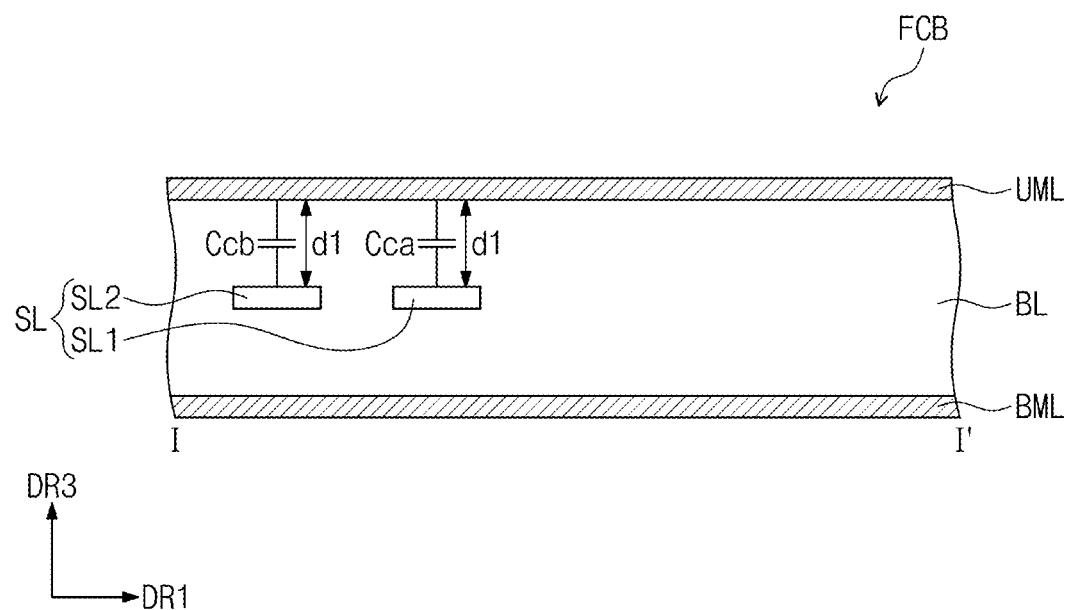
FIG. 5 is a cross-sectional view of a comparative embodiment of the circuit board taken along line I-I' of FIG. 3.

FIG. 5 is a cross-sectional view of an embodiment (e.g., comparative embodiment) of the circuit board taken along line I-I' of FIG. 3.

Referring to FIG. 5, the circuit board FCB includes an upper conductive layer UML (or a first conductive layer), a base layer BL, a lower conductive layer BML (or a second conductive layer), and the signal lines SL. On an upper portion of the upper conductive layer UML, a protection layer (or a coating layer) may be disposed. In addition, on a lower portion of the lower conductive layer BML, a protection layer may be disposed. In the following description, the terms "upper" and "lower" are merely named according to positions in the third direction DR3 with respect to the signal lines SL, and the embodiments of the invention are not limited thereto.

The base layer BL may include a polyimide-based material, a Teflon-based material, a material obtained by synthesizing a polyimide-based material and a Teflon-based material, or an insulation layer having flexibility. In addition, the base layer BL may include a first adhesive layer to couple the insulation layer and the upper conductive layer UML and a second adhesive layer to couple the insulation layer and the lower conductive layer BML.

The upper conductive layer UML and the lower conductive layer BML may be formed of a conductive material such as copper. The upper conductive layer UML and the lower conductive layer BML may be electrically connected to a ground voltage in order to protect the signal lines SL from an electromagnetic interference (EMI) or noise. The upper conductive layer UML and the lower conductive layer BML may be electrically connected through a via-hole passing through the base layer BL. Any one of the upper conductive layer UML and the lower conductive layer BML may be electrically connected to the connector CNT to receive the ground voltage.

The signal lines SL may include a first signal line SL1 and a second signal line SL2. The first signal line SL1 and the second signal line SL2 may be formed of a conductive material having a predetermined width and a predetermined thickness. FIG. 5 illustrates that the first signal line SL1 and the second signal line SL2 are formed on the same layer. However, the first signal line SL1 and the second signal line SL2 may be formed on different layers and overlap each other in the third direction DR3. In this case, the first signal line SL1 and the second signal line SL2 may be insulated from each other by an insulation layer.

The first signal line SL1 and the second signal line SL2 may be disposed to overlap the upper conductive layer UML as shown in FIG. 5, and may be spaced apart therefrom by a predetermined distance d1. In addition, the first signal line SL1 and the second signal line SL2 may be spaced apart from the lower conductive layer BML by a predetermined distance.

Between the first signal line SL1 and the upper conductive layer UML, a first parasitic capacitance Cca (or referred to as a parasitic capacitance) may be formed. Between the second signal line SL2 and the upper conductive layer UML, a second parasitic capacitance Ccb may be formed.

As illustrated in FIG. 3, when the length L1 of the signal lines SL1 and SL2 between the driving circuit DIC and the connector CNT increases, the first parasitic capacitance Cca and the second parasitic capacitance Ccb may increase. When the first parasitic capacitance Cca and the second parasitic capacitance Ccb increase, signals transmitted through the first signal line SL1 and the second signal line SL2 may be leaked to the upper conductive layer UML and distorted.

Similarly, a parasitic capacitance is also formed between each of the first signal line SL1 and the second signal line SL2 and the lower conductive layer BML so that signals transmitted through the first signal line SL1 and the second signal line SL2 may be distorted.

Figure 6:
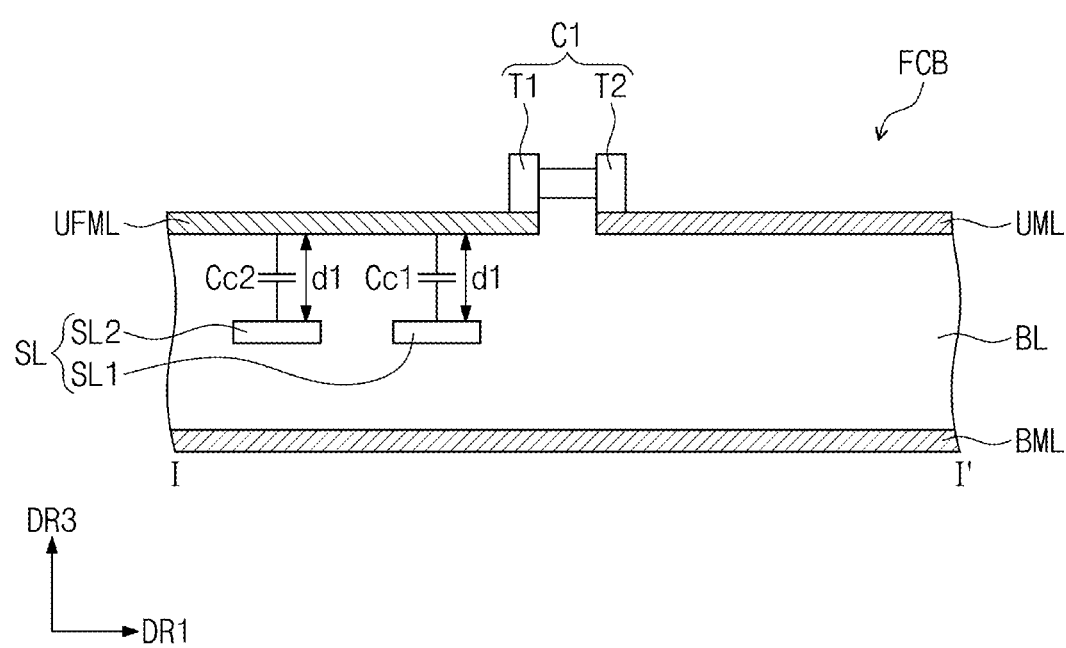
FIG. 6 is a cross-sectional view of another embodiment of the circuit board taken along line I-I' of FIG. 3.

FIG. 6 is a cross-sectional view of another embodiment of the circuit board taken along line I-I' of FIG. 3.

Referring to FIG. 6, the circuit board FCB includes the upper conductive layer UML (or the first conductive layer), the base layer BL, the lower conductive layer BML (or the second conductive layer), an upper floating layer UFML (or a first floating layer), and the signal lines SL. On an upper portion of the upper conductive layer UML and of the upper floating layer UFML, a protection layer (or a coating layer) may be disposed. In addition, on a lower portion of the lower conductive layer BML, a protection layer may be disposed.

The base layer may be composed of a polyimide-based material, a Teflon-based material, a material obtained by synthesizing a polyimide-based material and a Teflon-based material, or an insulation material having flexibility.

The upper conductive layer UML, the lower conductive layer BML, and the upper floating layer UFML may be formed of a conductive material such as copper. The upper conductive layer UML and the upper floating layer UFML may be formed of the same material in the same process.

The upper conductive layer UML and the lower conductive layer BML may be electrically connected to a ground voltage in order to protect the signal lines SL from an electromagnetic interference (EMI) or noise.

The upper conductive layer UML and the upper floating layer UFML may be spaced apart in the first direction DR1 and/or the second direction DR2 (see FIG. 3) to be electrically separated from each other. As a result, the upper floating layer UFML may be maintained in an electrically floating state in which signals are not applied thereto.

The circuit board FCB further includes a first capacitor C1. A first terminal T1 of the first capacitor C1 is connected to the upper floating layer UFML, and a second terminal T2 of the first capacitor C1 is connected to the upper conductive layer UML. The first terminal T1 of the first capacitor C1 may be directly connected to the upper floating layer UFML, and the second terminal T2 of the first capacitor C1 may be directly connected to the upper conductive layer UML. For example, even when the protection layer (or the coating layer) is disposed on the upper portion of the upper floating layer UFML and on the upper portion of the upper conductive layer UML, the first terminal T1 of the first capacitor C1 may be directly electrically connected to the upper floating layer UFML, and the second terminal T2 of the first capacitor C1 may be directly electrically connected to the upper conductive layer UML.

The signal lines SL may include the first signal line SL1 and the second signal line SL2. The first signal line SL1 and the second signal line SL2 may be formed of a conductive material having a predetermined width and a predetermined thickness.

The first signal line SL1 may be spaced apart from the upper floating layer UFML by the predetermined distance d1, and the second signal line SL2 may be spaced apart from the upper floating layer UFML by the predetermined distance d1. Although the separation distance between the first signal line SL1 and the upper floating layer UFML and the separation distance between the second signal line SL2 and the upper floating layer UFML are illustrated to be the same as d1, the embodiments are not limited thereto. For example, the separation distance between the first signal line SL1 and the upper floating layer UFML and the separation distance between the second signal line SL2 and the upper floating layer UFML may be different from each other. In addition, the first signal line SL1 and the second signal line SL2 may be spaced apart from the lower conductive layer BML by a predetermined distance.

Between the first signal line SL1 and the upper conductive layer UFML, a first parasitic capacitance Cc1 may be formed. Between the second signal line SL2 and the upper conductive layer UFML, a second parasitic capacitance Cc2 may be formed.

Figure 7A:
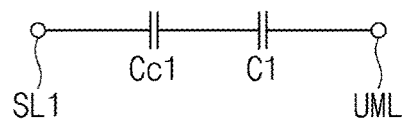
FIG. 7A is a schematic diagram showing a capacitance between the first signal line and the upper conductive layer of FIG. 6.

FIG. 7A is a conceptual schematic diagram to describe the capacitance between the first signal line SL1 and the upper conductive layer UML of FIG. 6.

Referring to FIG. 6 and FIG. 7A, the first parasitic capacitance Cc1 formed between the first signal line SL1 and the upper floating layer UFML is connected to the first capacitor C1 in series. When the first parasitic capacitance Cc1 and the first capacitor C1 are connected in series between the first signal line SL1 and the upper conductive layer UML, the total capacitance C between the first signal line SL1 and the upper conductive layer UML becomes smaller than the first parasitic capacitance Cc1 (C<Cc1). The capacitance C between the first signal line SL1 and the upper conductive layer UML may be represented by Equation 1 below.

$$1/C = 1/Cc1 + 1/C1 \quad \text{[Equation 1]}$$

As shown in Equation 1, the total capacitance C between the first signal line SL1 and the upper conductive layer UML may be determined according to the first parasitic capacitance Cc1 and the capacitance of the first capacitor C1. For example, when the capacitance of the first capacitor C1 is set to correspond to the first parasitic capacitance Cc1 (C1=Cc1), the total capacitance C may be about ½ of the first parasitic capacitance Cc1. That is, when the capacitance of the first capacitor C1 is determined based on the first parasitic capacitance Cc1, the total capacitance C between the first signal line SL1 and the upper conductive layer UML may be reduced. As the total capacitance C between the first signal line SL1 and the upper conductive layer UML is reduced, the distortion of signals transmitted through the first signal line SL1 may also be reduced.

Figure 7B:
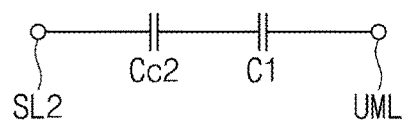
FIG. 7B is a schematic diagram showing a capacitance between the second signal line and the upper conductive layer of FIG. 6.

FIG. 7B is a schematic diagram showing a capacitance between the second signal line SL2 and the upper conductive layer UML of FIG. 6.

Referring to FIG. 6 and FIG. 7B, the second parasitic capacitance Cc2 formed between the second signal line SL2 and the upper floating layer UFML is connected to the first capacitor C1 in series. When the second parasitic capacitance Cc2 and the first capacitor C1 are connected in series between the second signal line SL2 and the upper conductive layer UML, the total capacitance C between the second signal line SL2 and the upper conductive layer UML becomes smaller than the second parasitic capacitance Cc2 (C<Cc2). For example, when the capacitance of the first capacitor C1 is set to correspond to the second parasitic capacitance Cc2, the total capacitance C may be about ½ of the second parasitic capacitance Cc2. As the total capacitance C between the second signal line SL2 and the upper conductive layer UML is reduced, the distortion of signals transmitted through the second signal line SL2 may also be reduced.

Figure 8:
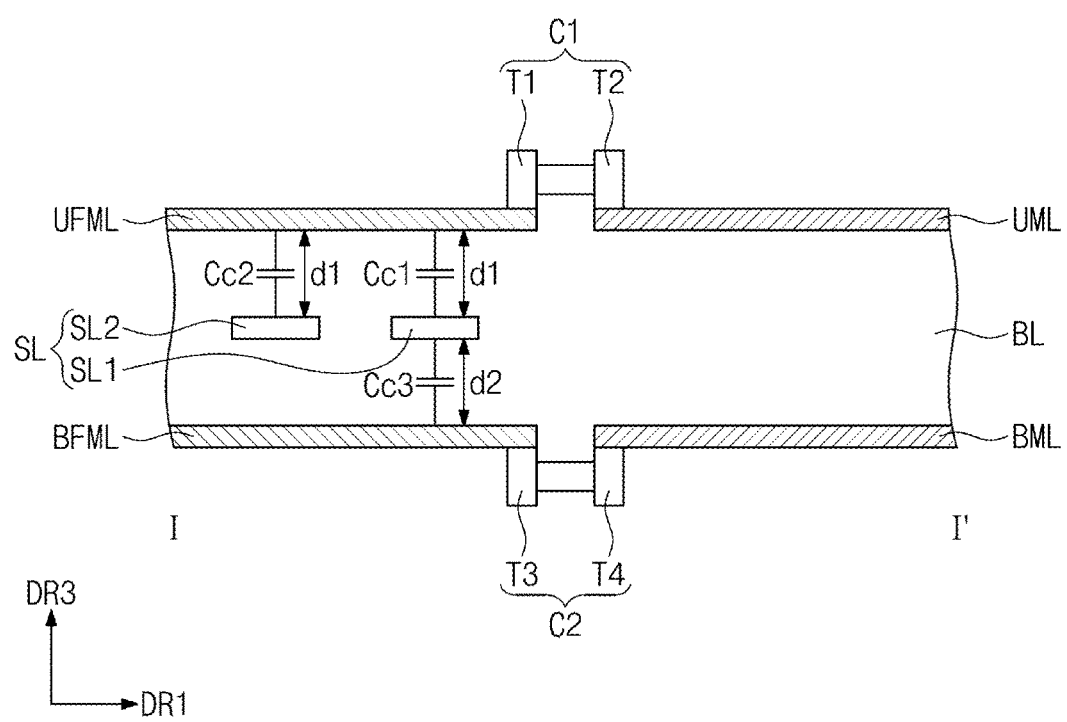
FIG. 8 is a cross-sectional view of still another embodiment of the circuit board taken along line I-I' of FIG. 3.

FIG. 8 is a cross-sectional view of still another embodiment of the circuit board taken along line I-I' of FIG. 3.

Referring to FIG. 8, the circuit board FCB includes the upper conductive layer UML (or the first conductive layer), the base layer BL, the lower conductive layer BML (or the second conductive layer), the upper floating layer UFML (or the first floating layer), a lower floating layer BFML (or a second floating layer) and the signal lines SL. On the upper portion of the upper conductive layer UML and of the upper floating layer UFML, a protection layer (or a coating layer) may be disposed. In addition, on a lower portion of the lower conductive layer BML and of the lower floating layer BFML, a protection layer may be disposed.

The base layer BL may be composed of a polyimide-based material, a Teflon-based material, a material obtained by synthesizing a polyimide-based material and a Teflon-based material, or an insulation material having flexibility.

The upper conductive layer UML, the lower conductive layer BML, the upper floating layer UFML, and the lower floating layer BFML may be composed of a conductive material such as copper. The upper conductive layer UML and the upper floating layer UFML may be formed of the same material in the same process. Also, the lower conductive layer BML and the lower floating layer BFML may be formed of the same material in the same process.

The upper conductive layer UML and the lower conductive layer BML may each be electrically connected to a ground voltage in order to protect the signal lines SL from an electromagnetic interference (EMI) or noise.

The upper conductive layer UML and the upper floating layer UFML may be spaced apart in the first direction DR1 and/or the second direction DR2 (see FIG. 3) to be electrically separated from each other. As a result, the upper floating layer UFML may be maintained in a floating state. The lower conductive layer BML and the lower floating layer BFML may be spaced apart in the first direction DR1 and/or the second direction DR2 (see FIG. 3) to be electrically separated from each other. As a result, the lower floating layer BFML may be maintained in a electrically floating state.

The circuit board FCB further includes the first capacitor C1 and a second capacitor C2. The first terminal T1 of the first capacitor C1 is connected to the upper floating layer UFML, and the second terminal T2 of the first capacitor C1 is connected to the upper conductive layer UML. The first terminal T1 of the first capacitor C1 may be directly connected to the upper floating layer UFML, and the second terminal T2 of the first capacitor C1 may be directly connected to the upper conductive layer UML. For example, even when the protection layer (or the coating layer) is disposed on the upper portion of the upper floating layer UFML and on the upper portion of the upper conductive layer UML, the first terminal T1 of the first capacitor C1 may be directly electrically connected to the upper floating layer UFML, and the second terminal T2 of the first capacitor C1 may be directly electrically connected to the upper conductive layer UML.

A first terminal T3 of the second capacitor C2 is connected to the lower floating layer BFML, and a second terminal T4 of the second capacitor C2 is connected to the lower conductive layer BML. The first terminal T3 of the second capacitor C2 may be directly connected to the lower floating layer BFML, and the second terminal T4 of the second capacitor C2 may be directly connected to the lower conductive layer BML. For example, even when the protection layer (or the coating layer) is disposed on the lower portion of the lower floating layer BFML and on the lower portion of the lower conductive layer BML, the first terminal T3 of the second capacitor C2 may be directly connected to the lower floating layer BFML, and the second terminal T4 of the second capacitor C2 may be directly connected to the lower conductive layer BML.

The signal lines SL may include the first signal line SL1 and the second signal line SL2. The first signal line SL1 and the second signal line SL2 may be formed of a conductive material having a predetermined width and a predetermined thickness.

Each of the first signal line SL1 and the second signal line SL2 may be spaced apart from the upper floating layer UFML by the predetermined distance d1. Between the first signal line SL1 and the upper floating layer UFML, the first parasitic capacitance Cc1 may be formed. Between the second signal line SL2 and the upper conductive layer UFML, the second parasitic capacitance Cc2 may be formed.

As described with reference to FIG. 6 to FIG. 7B above, the capacitance between the first signal line SL1 and the upper conductive layer UML may be reduced due to the series connection of the first parasitic capacitance Cc1 and the first capacitor C1. In addition, the capacitance between the second signal line SL2 and the upper conductive layer UML may be reduced due to the series connection of the second parasitic capacitance Cc2 and the first capacitor C1.

Figure 9:
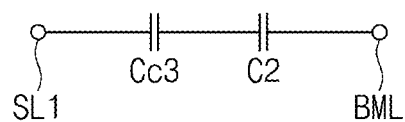
FIG. 9 is a schematic diagram showing a capacitance between the first signal line and the lower conductive layer of FIG. 8.

FIG. 9 is a schematic diagram showing a capacitance between the first signal line SL1 and the lower conductive layer BML of FIG. 8.

Referring to FIG. 8 and FIG. 9, the first signal line SL1 is spaced apart from the lower floating layer BFML by a predetermined distance d2. A third parasitic capacitance Cc3 formed between the first signal line SL1 and the lower floating layer BFML is connected to the second capacitor C2 in series. When the third parasitic capacitance Cc3 and the second capacitor C2 are connected in series between the first signal line SL1 and the lower conductive layer BML, the total capacitance C between the first signal line SL1 and the lower conductive layer BML becomes smaller than the third parasitic capacitance Cc3 (C<Cc3). For example, when the capacitance of the second capacitor C2 is set to correspond to the third parasitic capacitance Cc3 (C2=Cc3), the total capacitance C between the first signal line SL1 and the lower conductive layer BML may be about ½ of the third parasitic capacitance Cc3.

As the capacitance between the first signal line SL1 and the upper conductive layer UML is reduced by the first capacitor C1 and the capacitance between the first signal line SL1 and the lower conductive layer BML is reduced by the second capacitor C2, the distortion of signals transmitted through the first signal line SL1 may be reduced.

Figure 10:
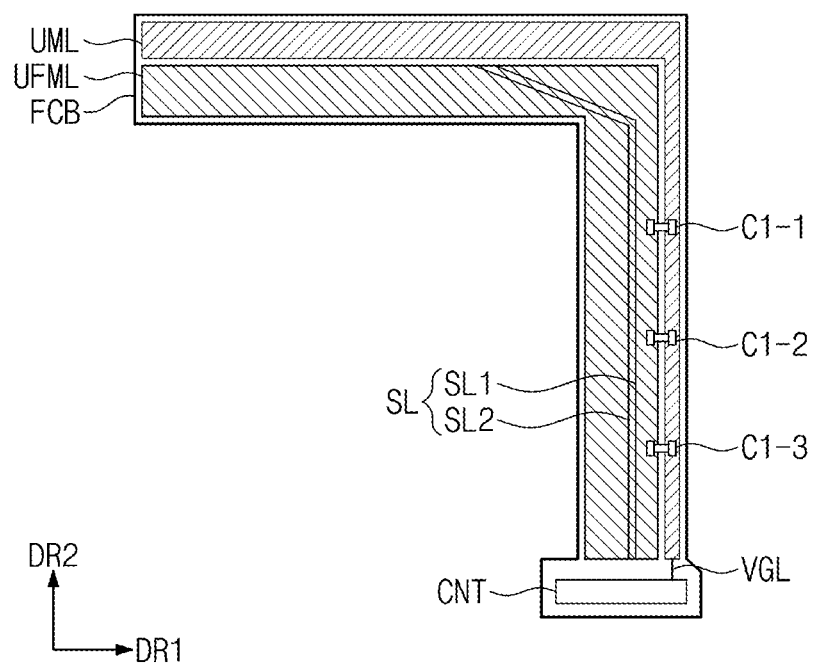
FIG. 10 is a plan view illustratively showing the upper floating layer and the upper conductive layer of the circuit board shown in FIG. 3.

FIG. 10 is a plan view illustratively showing the upper floating layer UFML and the upper conductive layer UML of the circuit board FCB shown in FIG. 3.

Referring to FIG. 10, the circuit board FCB includes the upper floating layer UFML and the upper conductive layer UML. The upper floating layer UFML and the upper conductive layer UML may be formed of the same material in the same process. The upper floating layer UFML and the upper conductive layer UML may be spaced apart in the first direction DR1 and the second direction DR2 so as to be electrically separated.

The upper floating layer UFML may have a reversed "L" shape so as to overlap the signal lines SL1 and SL2 as shown in FIG. 10. The upper floating layer UFML may have a generally polygonal shape so as to overlap all of the signal lines SL1 and SL2. The upper floating layer UFML may have a generally rectangular shape so as to overlap some of the signal lines SL on a plane.

The upper conductive layer UML may be electrically connected to the connector CNT through a power line VGL. The upper conductive layer UML may be provided with a ground voltage through the connector CNT and the power line VGL.

One or more capacitors may be connected in series between the upper floating layer UFML and the upper conductive layer UML. In the example illustrated in FIG. 10, three capacitors C1-1, C1-2, and C1-3 are disposed in series between the upper floating layer UFML and the upper conductive layer UML, but the embodiments are not limited thereto.

The lower floating layer BFML and the lower conductive layer BML illustrated in FIG. 8 may have substantially the same shapes as those of the upper floating layer UFML and the upper conductive layer UML illustrated in FIG. 10, respectively.

Figure 11:
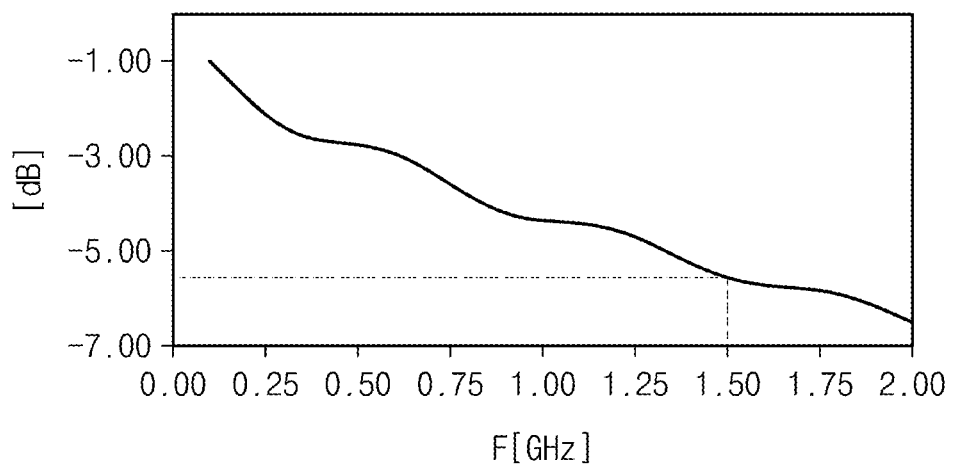
FIG. 11 and FIG. 12 are graphs illustratively showing insertion loss according to signal frequencies transmitted through signal lines.
Figure 12:
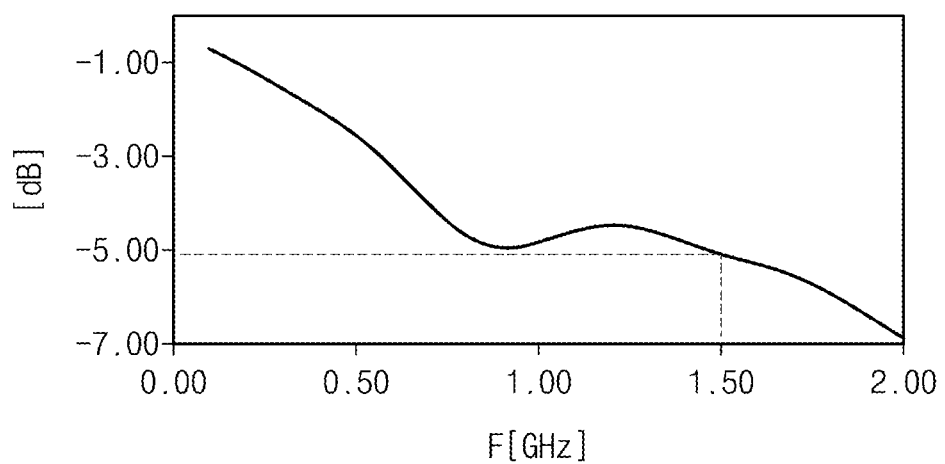

FIG. 11 and FIG. 12 are graphs illustratively showing insertion loss according to signal frequencies transmitted through signal lines. Specifically, FIG. 11 is a graph corresponding to the embodiment of FIG. 5 and FIG. 12 is a graph corresponding to the embodiment of FIG. 6.

First, referring to FIG. 11, the upper conductive layer UML may overlap the first and second signal lines SL1 and SL2 as shown in FIG. 5. The first parasitic capacitance Cca may be formed between the first signal line SL1 and the upper conductive layer UML, the second parasitic capacitance Ccb may be formed between the second signal line SL2 and the upper conductive layer UML.

When the length L1 shown in FIG. 3 of the signal lines SL1 and SL2 between the driving circuit DIC and the connector CNT increases, the first parasitic capacitance Cca and the second parasitic capacitance Ccb may increase.

The MIPI interface, which is one of the high speed interfaces, requires an insertion loss to be −5 dB or greater when a frequency is 1.5 GHz. However, when the length L1 of the signal lines SL1 and SL2 between the driving circuit DIC and the connector CNT increases, the insertion loss may be lowered to −5 dB or less as illustrated in FIG. 11.

Next, referring to FIG. 12, on upper portions of the first and second signal lines SL1 and SL2 as shown in FIG. 6, the upper floating layer UFML may be disposed. The upper floating layer UFML is not electrically connected to the upper conductive layer UML. The circuit board FCB further includes the first capacitor C1. The first terminal T1 of the first capacitor C1 is connected to the upper floating layer UFML, and the second terminal T2 of the first capacitor C1 is connected to the upper conductive layer UML.

The first parasitic capacitance Cc1 formed between the first signal line SL1 and the upper floating layer UFML is connected to the first capacitor C1 in series. When the first parasitic capacitance Cc and the first capacitor C1 are connected in series between the first signal line SL1 and the upper conductive layer UML (see FIG. 7A), the total capacitance C between the first signal line SL1 and the upper conductive layer UML may become smaller than the first parasitic capacitance Cc1. As a result, as illustrated in FIG. 12, the condition in which the insertion loss is −5 dB or greater when the frequency of the signals transmitted through the first signal line SL1 is 1.5 GHz may be satisfied.

A circuit board constructed according the above principles and embodiments of the invention may prevent the deterioration in signal transmission characteristics even when the length of signal lines is increased. Therefore, it is possible to reduce of prevent the deterioration in display quality of a display device.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A circuit board for a display device, the circuit board comprising:
a signal line to transmit a signal;
a first metallic layer including a first floating layer having a generally polygonal shape substantially entirely overlapping the signal line;
a first conductive layer spaced apart from the first metallic layer and electrically isolated from the signal line;
a base layer insulating the signal line from the first metallic layer and from the first conductive layer; and
a first capacitor including a first terminal electrically coupled to the first metallic layer and a second terminal electrically coupled to the first conductive layer.

2. The circuit board of claim 1, wherein the first conductive layer is configured to receive a ground voltage.

3. The circuit board of claim 1, wherein the first terminal of the first capacitor directly contacts the first metallic layer and the second terminal thereof directly contacts the first conductive layer.

4. The circuit board of claim 1, wherein the first metallic layer and the first conductive layer are formed of the same material and disposed on a first surface of the base layer.

5. The circuit board of claim 1, further comprising:
a second metallic layer overlapping the signal line;
a second conductive layer spaced apart from the second metallic layer; and
a second capacitor including a first terminal electrically coupled to the second metallic layer and a second terminal electrically coupled to the second conductive layer.

6. The circuit board of claim 5, wherein:
the second metallic layer and the second conductive layer are formed of the same material and disposed on a second surface of the base layer; and
the base layer insulates the signal line from the second metallic layer and from the second conductive layer.

7. The circuit board of claim 1, wherein
a capacitance between the signal line and the first conductive layer is determined by a parasitic capacitance between the signal line and the first metallic layer and a first capacitance of the first capacitor; and
the first capacitance of the first capacitor is determined in relation to the parasitic capacitance between the signal line and the first metallic layer.

8. A display device comprising:
a display panel to display image and including a first pad; and
a circuit board including a second pad to be connected to the first pad of the display panel, wherein the circuit board comprises:
a signal line to transmit signal;
a first metallic layer overlapping the signal line;
a first conductive layer spaced apart from the first metallic layer and electrically isolated from the signal line;
a base layer insulating the signal line from the first metallic layer and from the first conductive layer;
a first capacitor including a first terminal electrically coupled to the first metallic layer and a second terminal electrically coupled to the first conductive layer
a second metallic layer overlapping the signal line;
a second conductive layer spaced apart from the second metallic layer; and
a second capacitor including a first terminal electrically coupled to the second metallic layer and a second terminal electrically coupled to the second conductive layer.

9. The display device of claim 8, wherein the circuit board further comprises a driving circuit to be electrically connected to the second pad.

10. The display device of claim 9, wherein
the circuit board further comprises a connector; and
the signal line is electrically coupled to the driving circuit and the connector.

11. The display device of claim 8, wherein the first metallic layer comprises a first floating layer having a generally polygonal shape entirely overlapping the signal line.

12. The display device of claim 8, wherein the first conductive layer is configured to receive a ground voltage.

13. The display device of claim 8, wherein the first terminal of the first capacitor directly contacts the first metallic layer, and the second terminal thereof directly contacts the first conductive layer.

14. The display device of claim 8, wherein the first metallic layer and the first conductive layer are formed of the same material and are disposed on a first surface of the base layer.

15. The display device of claim 8, wherein
the second metallic layer and the second conductive layer are formed of the same material and disposed on a second surface of the base layer; and
the base layer insulates the signal line from the second metallic layer and the second conductive layer.

16. The display device of claim 8, wherein a first capacitance of the first capacitor is determined in relation to a parasitic capacitance between the signal line and the first metallic layer.

17. The display device of claim 8, wherein the circuit board comprises a flexible circuit board.

18. The display device of claim 8, wherein the base layer comprises an insulation layer having flexibility.

* * * * *